United States Patent
Momokawa

(10) Patent No.: US 8,253,250 B2
(45) Date of Patent: Aug. 28, 2012

(54) INTERCONNECTION STRUCTURE OF ELECTRONIC DEVICE HAVING MULTILAYER INTERCONNECTIONS STRUCTURE WITH ELECTRICALLY CONDUCTIVE LAYERS

(75) Inventor: Yuuki Momokawa, Tokyo (JP)

(73) Assignee: NEC Corporation, Tokyo (JP)

( * ) Notice: Subject to any disclaimer, the term of this patent is extended or adjusted under 35 U.S.C. 154(b) by 69 days.

(21) Appl. No.: 12/593,524

(22) PCT Filed: Jan. 28, 2008

(86) PCT No.: PCT/JP2008/051181
§ 371 (c)(1),
(2), (4) Date: Dec. 7, 2009

(87) PCT Pub. No.: WO2008/126447
PCT Pub. Date: Oct. 23, 2008

(65) Prior Publication Data
US 2010/0117239 A1    May 13, 2010

(30) Foreign Application Priority Data
Mar. 30, 2007  (JP) .................................. 2007-091490

(51) Int. Cl.
*H01L 23/48* (2006.01)
(52) U.S. Cl. ........ 257/758; 257/698; 257/700; 257/760; 257/774; 257/E23.145; 257/E23.169; 257/E23.178
(58) Field of Classification Search .................. 257/698, 257/700, 758, 760, 774, E23.145, E23.169, 257/E23.178
See application file for complete search history.

(56) References Cited

U.S. PATENT DOCUMENTS

| | | | |
|---|---|---|---|
| 2004/0140549 A1* | 7/2004 | Miyagawa | 257/700 |
| 2007/0222039 A1* | 9/2007 | Kanda et al. | 257/635 |

FOREIGN PATENT DOCUMENTS

| | | |
|---|---|---|
| JP | 6-13490 A | 1/1994 |
| JP | 2004247668 A | 9/2004 |
| JP | 2006013248 A | 1/2006 |
| JP | 2006019441 A | 1/2006 |
| JP | 2006253175 A | 9/2006 |
| WO | 2004038793 A | 5/2004 |

OTHER PUBLICATIONS

International Search Report for PCT/JP2008/051181 mailed Mar. 4, 2008.

* cited by examiner

*Primary Examiner* — Andy Huynh

(57) ABSTRACT

An interconnection is formed on an object having a step by a screen printing method. The interconnection is formed by printing it on a substrate having an upper stage surface and a lower stage surface. A multilayer interconnection structure having a plurality of layers which are stacked is formed by repeatedly performing a process of printing and drying an interconnection pattern on the lower stage surface. Then, when the height of the multilayer interconnection structure approaches the height of the upper stage surface, an interconnection pattern of the uppermost layer is printed on the multilayer interconnection structure to extend onto the upper stage surface. Because the interconnection pattern of the uppermost layer is printed in a smaller step, the print characteristic is good. Thus, by the printing, the interconnection structure is formed which has a narrow interconnection width and surely connects the upper surface and the lower surface in a larger step than the interconnection width.

6 Claims, 15 Drawing Sheets

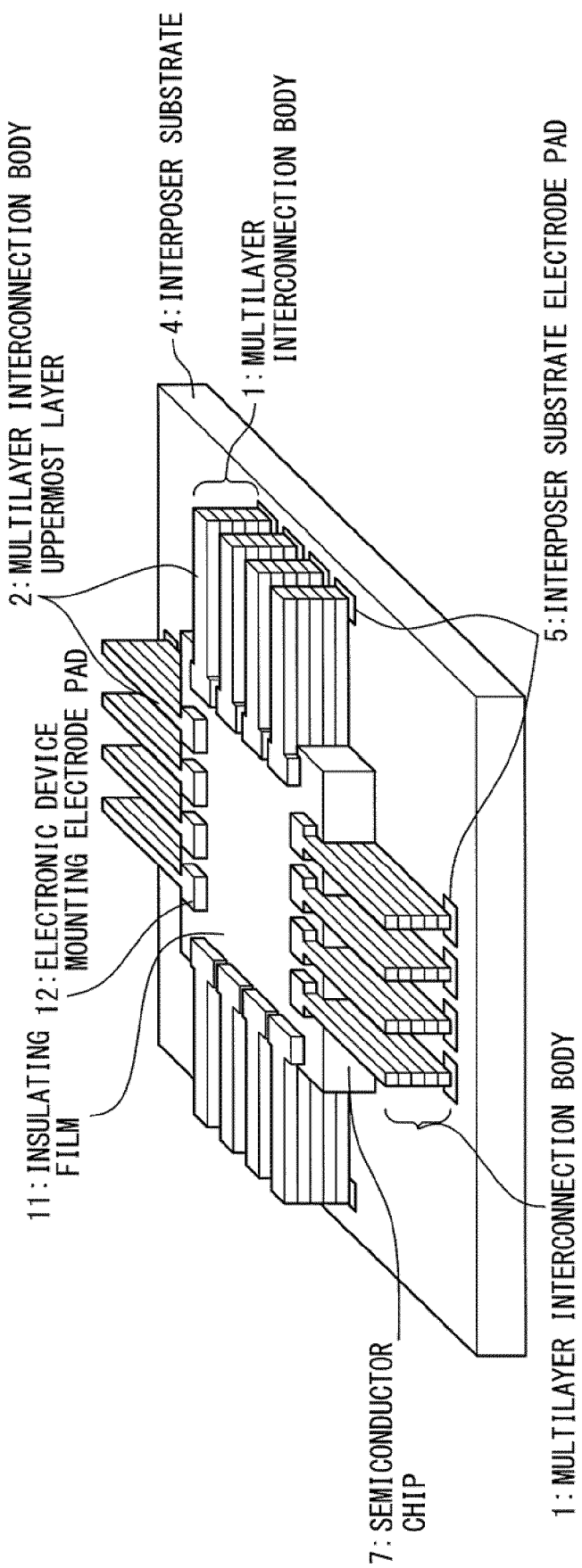

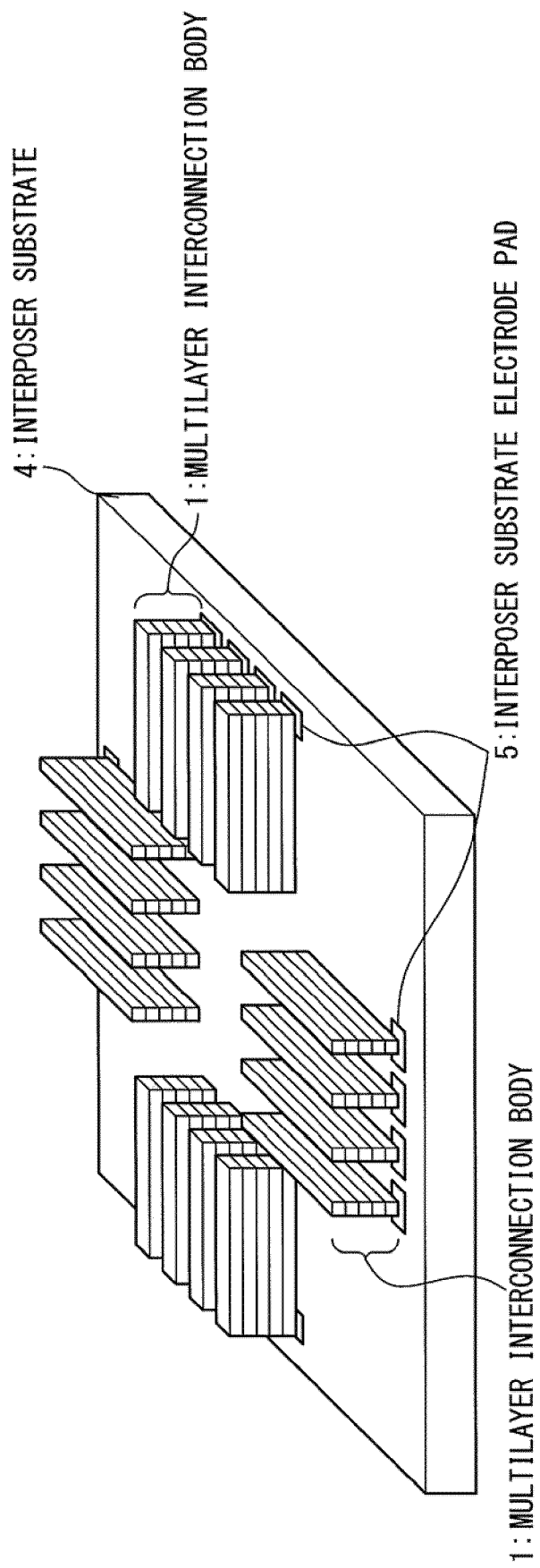

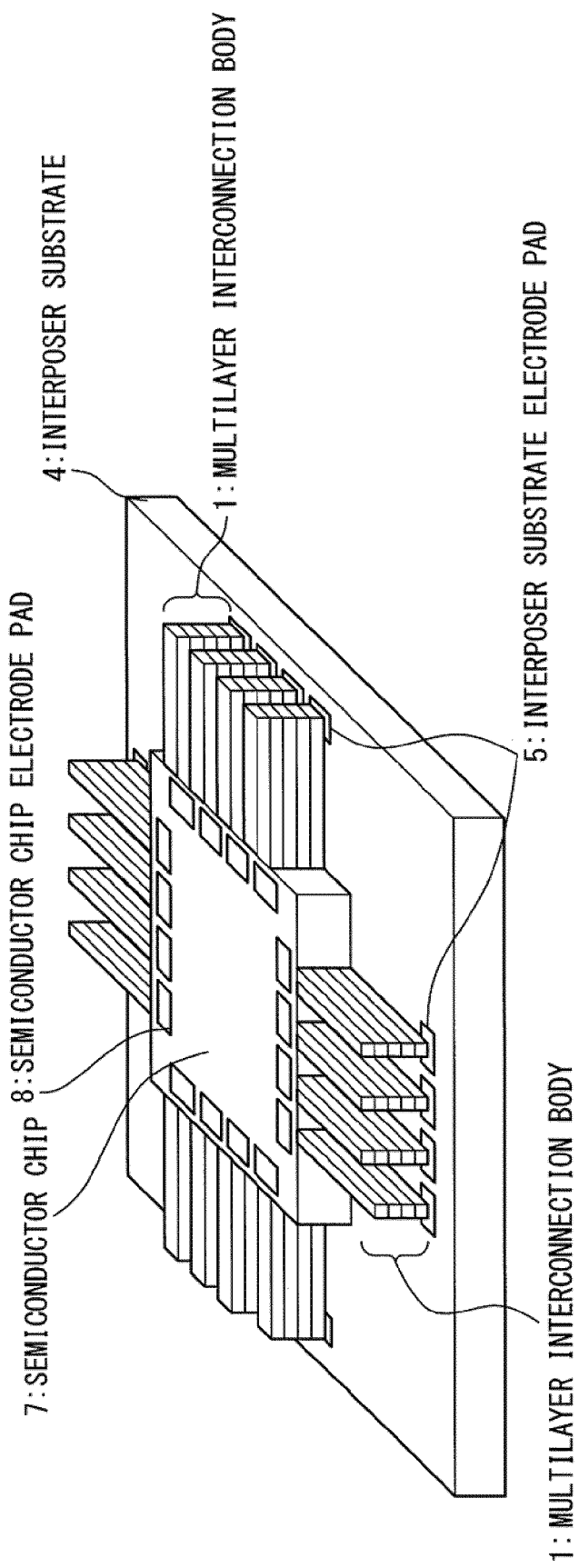

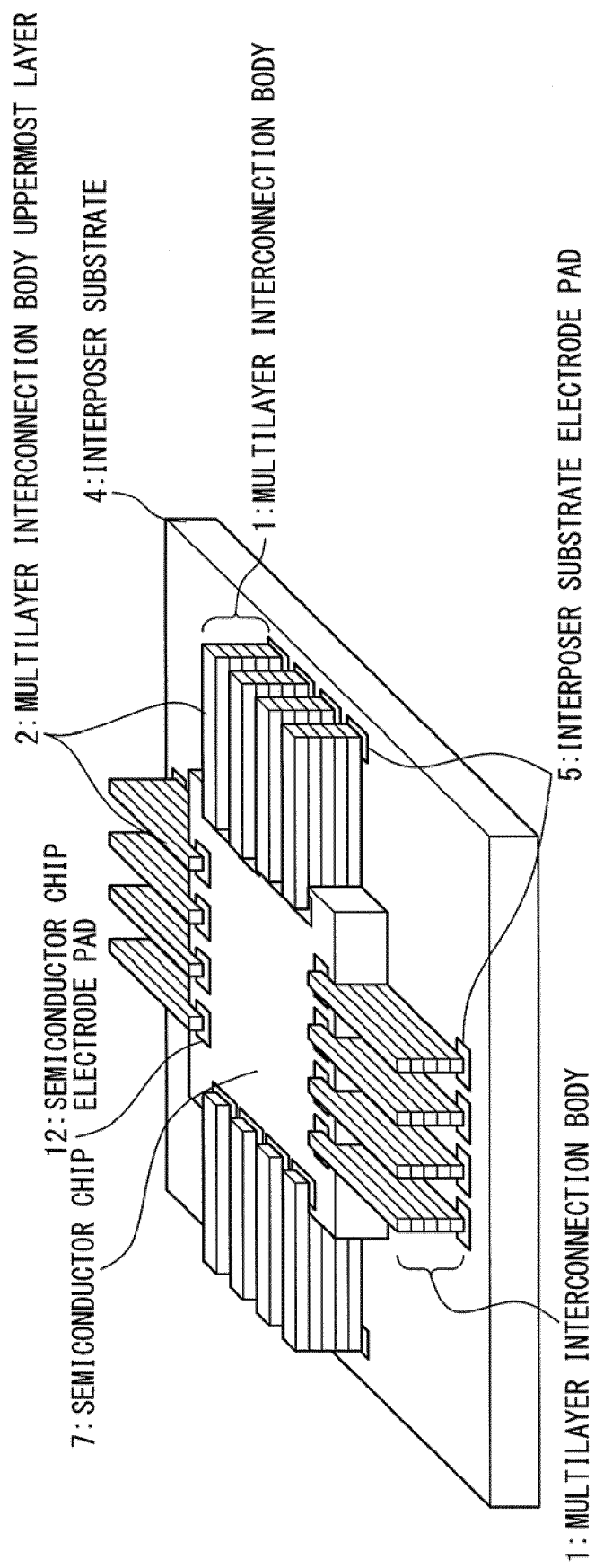

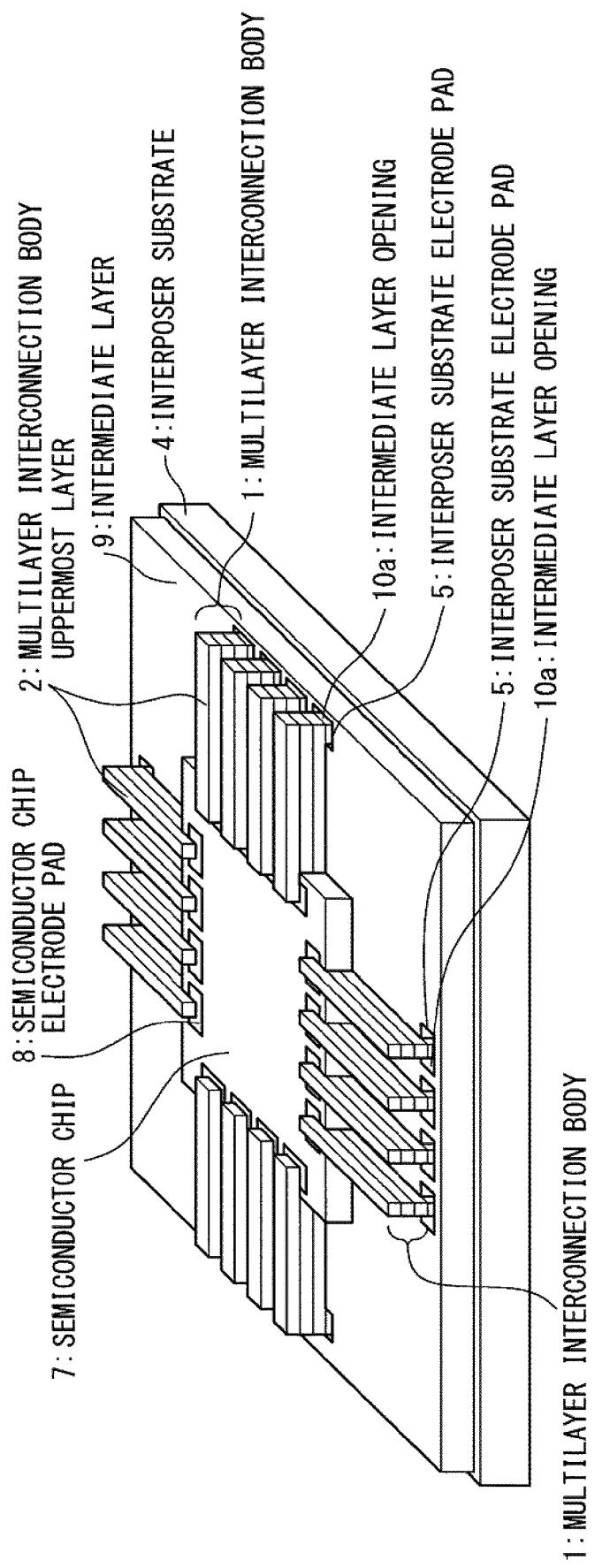

US 8,253,250 B2

INTERCONNECTION STRUCTURE OF ELECTRONIC DEVICE HAVING MULTILAYER INTERCONNECTIONS STRUCTURE WITH ELECTRICALLY CONDUCTIVE LAYERS

This patent application is the National Phase of PCT/JP2008/051181, filed Jan. 28, 2008, which is based upon and claims priority from Japanese Patent Application No. 2007-91490 filed on Mar. 30, 2007. The disclosure thereof is incorporated herein by reference.

BACKGROUND ART

Conventionally, an interconnection pattern used in an LSI package is generally formed by a plating method using photography. According to this method, a copper thin film that serves as a base of an interconnection pattern is formed on insulating resin by a sputtering method or the like. Photosensitive resin for forming etching resist is coated by using a spin coater or the like. Thereafter, for purposes of forming the etching resist, a pattern formed portion is exposed and developed by using a photo-mask so that the resin of a portion other than the developed portion is removed. By removing copper film other than a section of the interconnection pattern by etching, the interconnection pattern is completed. In order to protect the copper interconnection pattern, a solder resist is formed on all portions other than external electrode pads. The plating of material such as Ni, Ni/Au, and Ni/Pd/Au is performed to form a barrier layer for suppressing diffusion of copper into a solder supplied onto the external electrode pads, thus completing the interconnection pattern used in the LSI package.

On the other hand, an attempt is recently made to form the interconnection pattern by a printing and coating method of conductive resin or conductive ink in place of the above-mentioned interconnection pattern using a so-called photo-lithographic method. According to the method using the conductive resin, if the interconnection pattern is formed by a screen printing method and the resin is then hardened, circuit interconnections can be quickly produced and manufacturing steps can be considerably shortened. Further, because of an additive structure, this is an environmental friendly technique according to which removed components such as copper and waste fluid such as etchant are not produced.

Conventional techniques discovered by an applicant of the present application by a search are as follows:

First conventional example: Japanese Patent Application Publication (JP-P2006-13248A)

Second conventional example: Japanese Patent Application Publication (JP-P2006-253175A)

Third conventional example: PCT international Publication WO2004/038793.

DISCLOSURE OF THE INVENTION

However, in a case of forming an interconnection pattern by a printing method using the conductive resin as described above, it is desired that an interconnection pattern formation target is flat. If the interconnection pattern formation target is uneven, it is difficult to form the interconnection pattern. If the screen printing method is performed on a step, a screen mask cannot follow the step, so that a gap is formed between a print target to be printed and the screen mask. Since the conductive resin leaks from this gap, so that bleeding occurs, shapes of the interconnection pattern cannot be made uniform. Furthermore, if an inter-interconnection distance is narrow, this bleeding possibly causes short-circuit. Moreover, if unevenness is large, the gap between the print target and the screen mask is wide. As a result, the conductive resin cannot even contact the print target and the conductive resin is not transferred to the step, that is, disconnection occurs.

The present invention has been made in view of the above-described circumstances. It is a first object of the present invention to provide an interconnection structure that is applicable to a wide range of formation targets, that can be formed even in a step, that has high reliability, and that is environmental friendly, and an electronic device package using this interconnection structure.

Furthermore, it is a second object of the present invention to provide an interconnection structure that is applicable to a wide range of targets, that can be formed even in a step, that has high reliability, and that is environmental friendly, and an electronic device package manufacturing method.

An interconnection structure of an electronic equipment according to the present invention includes: a substrate having a lower stage surface and an upper stage surface arranged at a first height in a perpendicular direction to the lower stage surface; and a multilayer interconnection structure arranged on the lower stage surface and including a plurality of conductive resin layers stacked in the perpendicular direction. An uppermost layer of the plurality of conductive resin layers is provided to extend on the upper stage surface.

An electronic device package according to the present invention includes: a substrate; a semiconductor device arranged on the substrate; and a multilayer interconnection structure arranged on the substrate and including a plurality of conductive resin layers. An uppermost layer of the plurality of conductive resin layers extends onto an upper stage surface.

An electronic device package according to the present invention includes: a substrate; an intermediate layer arranged on the substrate; a semiconductor device arranged on the substrate and having an upper surface at a higher position than a position of the intermediate layer; and a multilayer interconnection structure arranged on the intermediate layer and including a plurality of conductive resin layers. An uppermost layer among the plurality of conductive resin layers extends onto the upper surface.

A method of manufacturing an electronic device package according to the present invention includes: forming a multilayer interconnection structure including a plurality of conductive resin layers by repeating a process of forming an interconnection pattern by printing a conductive resin layer in a first region on the substrate and drying the conductive resin layer; arranging a semiconductor device in a second region on the substrate; printing an uppermost layer made from a conductive resin layer and extending to an upper surface of the semiconductor element, on the multilayer interconnection structure; and hardening the plurality of conductive resin layers forming the multilayer interconnection body and the uppermost layer.

A method of manufacturing an electronic device package according to the present invention includes: forming an intermediate layer in a first region on a substrate by using insulating resin; and forming a multilayer interconnection structure including a plurality of conductive resin layers by repeating a process of forming an interconnection pattern on the intermediate layer by printing conductive resin layer and drying the conductive resin. A lowermost layer among the plurality of conductive resin layers is electrically connected to an external electrode pad surrounded by the first region and formed on the substrate. This manufacturing method further includes: arranging a semiconductor element in a second region on the substrate; printing an uppermost conductive resin layer made of conductive resin and extending to an upper surface of the semiconductor device, on the multilayer interconnection body; and hardening the conductive resin layers forming the multilayer interconnection structure and the uppermost layer.

The present invention can provide the interconnection structure that is applicable to a wide range of formation targets, that can be formed even in a step, that has high reliability and that is environmental friendly, and the electronic device package using this interconnection structure.

Furthermore, the present invention can provide the method of manufacturing the interconnection structure and the electronic device package that are applicable to a wide range of formation targets, that can be formed even in a step, that have high reliability and that is environmental friendly.

BRIEF DESCRIPTION OF THE DRAWINGS

FIG. 5A shows an electronic device package structure according to a third exemplary embodiment;

FIG. 6B shows the method of manufacturing the electronic device package according to the first exemplary embodiment;

FIG. 6C shows the method of manufacturing the electronic device package according to the first exemplary embodiment;

FIG. 6D shows the method of manufacturing the electronic device package according to the first exemplary embodiment;

FIG. 7E shows the method of manufacturing the electronic device package according to the second exemplary embodiment.

BEST MODE FOR CARRYING OUT THE INVENTION

Exemplary embodiments of an interconnection structure, an electronic device package structure, and a method of manufacturing a package having this structure according to the present invention will be described below with reference to the drawings.

A process of forming an electronic device interconnection structure according to the exemplary embodiments of the present invention will be outlined as follows. A printing method is performed to a substrate having an upper stage surface and a lower stage surface to form an interconnection pattern. At this time, a step of printing an interconnection pattern on the lower stage surface and drying the interconnection pattern is repeated, thereby forming multilayer interconnection bodies with a plurality of layers stacked. When the height of the multilayer interconnection body becomes nearly equal to that of the upper stage surface, the interconnection pattern of the uppermost layer is printed on the multilayer interconnection body. This uppermost layer interconnection pattern is extended up to a surface of the upper stage surface. Since the uppermost layer interconnection pattern has less unevenness, a good printing characteristic can be attained. By using such a method, the interconnection structure having a narrow interconnection width and reliably connecting a step larger than the interconnection width is formed by the printing method.

First Exemplary Embodiment

Figure 1:
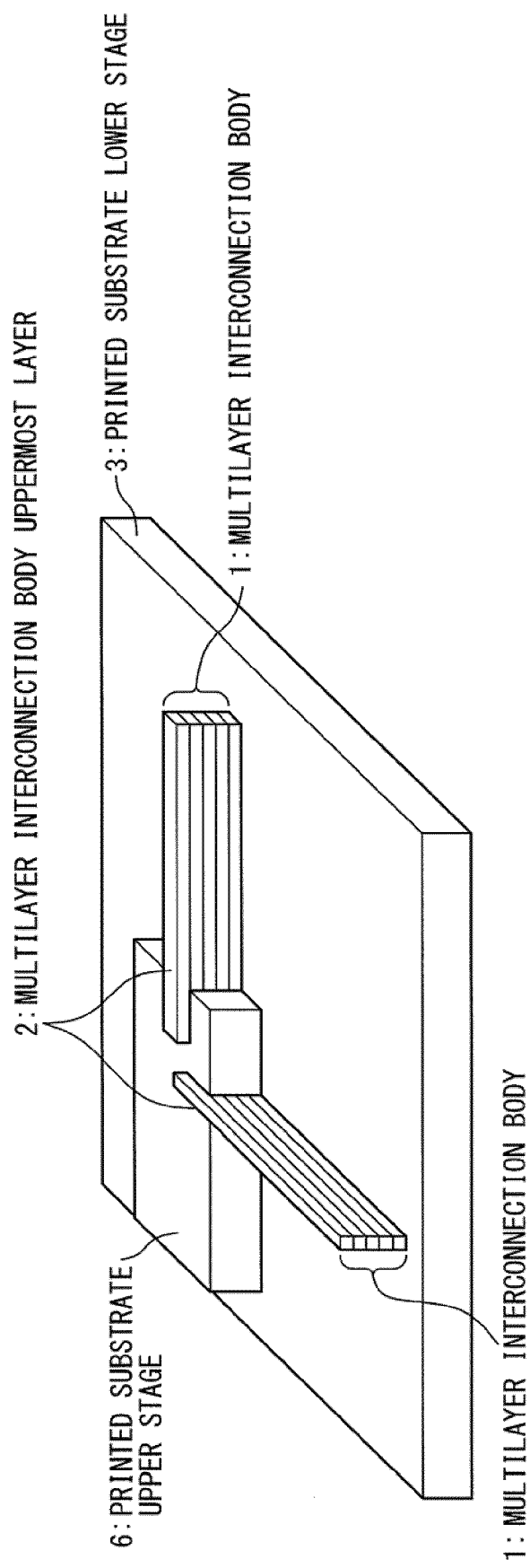
FIG. 1 shows an interconnection structure according to a first exemplary embodiment.

FIG. 1 is a perspective view specifically showing a basic interconnection structure according to a first exemplary embodiment of the present invention. In the interconnection structure shown in FIG. 1, multilayer interconnection bodies 1 are formed on a surface of a lower stage surface 3 of a printed substrate, and an uppermost layer 2 of each of these multilayer interconnection bodies 1 extends up to an upper stage surface 6 of the printed substrate. The uppermost layer 2 is preferably thinner from the view of making each interconnection body thinner. However, the thickness of the uppermost layer 2 is preferably equal to or larger than 0.5 μm and equal to or smaller than 20 μm since a resistance value increases if the interconnection body is thinner.

In the interconnection structure according to the present exemplary embodiment, the multilayer interconnection bodies 1 and the multilayer interconnection body uppermost layers 2 are formed of, for example, a sintered body of metal fine particles (fine particles of gold, silver, copper or the like), conductive resin or conductive ink (including an organic or inorganic composite in which conductive fine particles are dispersed).

It is preferable to make a pitch between interconnection patterns narrow in order to provide a high-density interconnection pattern. For this purpose, conductive paste or conductive ink that contains the metal fine particles having a particle diameter equal to or smaller than about 20 nm at least partially is preferably used as a raw material. If the material contains such metal fine particles, it is possible to not only narrow pitches but also realize improvement of conductivity by fusion-bonding of the fine particles.

If silver is used as filler of the conductive resin, ion migration that causes short-circuit between the interconnection patterns is likely to occur. To improve ion migration resistance, the entire interconnection pattern is preferably covered with a plated layer. The plated layer is preferably formed of a material having a good electrical characteristic, particularly, of Ni, Ni/Au, Ni/Pd/Au or the like. Further, to prevent the migration, it is preferable to form an insulating layer to cover the entire interconnection pattern.

It should be noted that FIG. 1 shows that the interconnection pattern is arranged to be orthogonal to the step for the sake of convenience. Needless to say, arrangement of the interconnection pattern is not limited to that shown in FIG. 1 and an angle between the step and the interconnection pattern may be changed arbitrarily.

In the present exemplary embodiment, a connection surface on which the upper stage surface 6 of the printed substrate is connected to the lower stage surface 3 of the printed substrate, that is, a side surface of a convex portion that forms the upper stage surface 6 of the printed substrate is almost perpendicular to the lower stage surface 3 of the printed substrate. A plurality of interconnection layers that constitute each of the multilayer interconnection bodies 1 are printed on the same interconnection pattern other than a portion in which the multilayer interconnection uppermost layer 2 extends to a portion at which the multilayer interconnection uppermost layer 2 is superimposed on the upper surface of the upper stage surface 6 of the printed substrate. That is, the plurality of interconnection layers that constitute each of the multilayer interconnection bodies 1 are almost identical in shape when being projected onto the lower stage surface 3 of the printed substrate. An end portion of such a multilayer interconnection body 1 is almost uniformly perpendicular to the lower stage surface 3 of the printed substrate. Thus, the end portion of each of the multilayer interconnection bodies 1 is uniform in shape to the side surface of the convex portion that forms the upper stage surface 6 of the printed substrate and fewer gaps are formed by printing. Therefore, printing can be performed while ensuring good characteristics of the multilayer interconnection bodies 1.

According to the interconnection structure described above, it is possible to form interconnection pattern of which a width-to-height ratio is equal to or higher than 1:1 and which cannot be normally produced by a screen printing method. As a consequence, it is possible to provide an interconnection structure having a high degree of freedom with which interconnection pattern can be formed even in a step, having high reliability, imposing lighter burden on environment, and low in cost. It is to be noted that a manufacturing method will be described on another occasion in description for the manufacturing method according to the present invention.

Second Exemplary Embodiment

Figure 2:
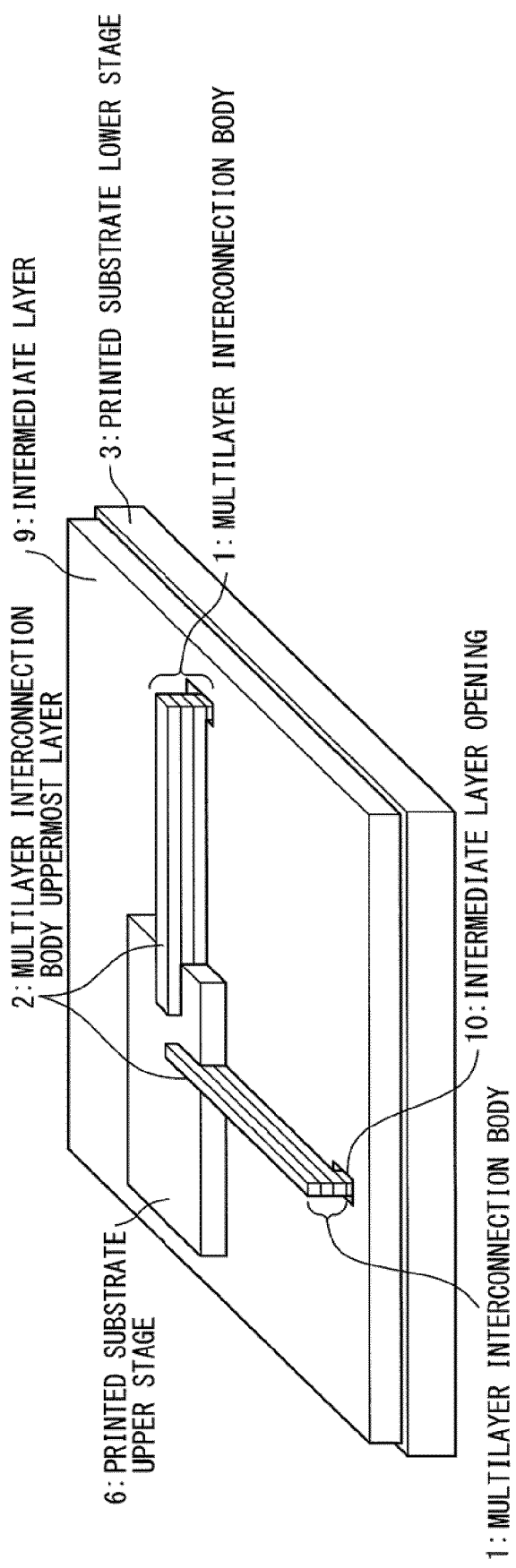
FIG. 2 shows an interconnection structure according to a second exemplary embodiment.

FIG. 2 is a perspective view schematically showing a basic interconnection structure according to a second exemplary embodiment of the present invention. In the interconnection structure shown in FIG. 2, an intermediate layer 9 is formed on a surface of the lower stage surface 3 of the printed substrate in a manner of partially contacting with the upper stage surface 6 of the printed substrate, and the multilayer interconnection bodies 1 are formed on this intermediate layer 9. The lowermost layer of each of these multilayer interconnection bodies 1 extends to a lowermost layer via an intermediate layer opening 10 formed in the intermediate layer 9, whereas the uppermost layer 2 of each of the multilayer interconnection bodies 1 extends to a position at which the uppermost layer 2 is superimposed on an upper surface of the upper stage surface 6 of the printed substrate. The uppermost layer is preferably thinner from the view of making each interconnection body thinner. However, the thickness of the uppermost layer 2 is preferably equal to or larger than 0.5 µm and equal to or smaller than 20 µm since a resistance value increases if the interconnection body is thinner.

In the interconnection structure according to the present invention, the multilayer interconnection bodies 1 and the multilayer interconnection body uppermost layers 6 can be formed of, for example, a sintered body of metal fine particles (fine particles of gold, silver, copper or the like), conductive resin or conductive ink (including an organic or inorganic composite in which conductive fine particles are dispersed).

It is preferable to form interconnection pattern at narrow pitches to provide a high-density interconnection pattern. To form the interconnection pattern at narrow pitches, conductive paste or conductive ink that contains metal fine particles having a particle diameter equal to or smaller than about 20 nm at least partially is preferably used as a raw material. If the material contains such metal fine particles, it is possible to not only narrow pitches but also realize improvement of conductivity by fusion-bonding of the fine particles.

In the case where silver is used as filler of the conductive resin, ion migration that causes short-circuit between the interconnections is likely to occur. To improve ion migration resistance, the entire interconnection pattern is preferably covered with a plated layer. The plated layer is preferably formed of a material having a good electrical characteristic, particularly, of Ni, Ni/Au, Ni/Pd/Au or the like. Further, to prevent the migration, it is preferable to form an insulating layer to cover the entire interconnection pattern.

It should be noted that FIG. 2 shows that the interconnection pattern is arranged to be orthogonal to the step for the sake of convenience. As already described above, an angle between the step and the interconnection body can be changed arbitrarily.

According to the interconnection structure described above, it is possible to form the interconnection pattern, of which a width-to-height ratio is equal to or higher than 1:1 and which cannot be normally produced by the screen printing method. As a consequence, it is possible to provide the interconnection structure having a high degree of freedom with which the interconnection pattern can be formed even in a step, having high reliability, imposing lighter burden on environment, and low in cost.

<Electronic Device Package Structure (First Exemplary Embodiment)>

Figure 3:
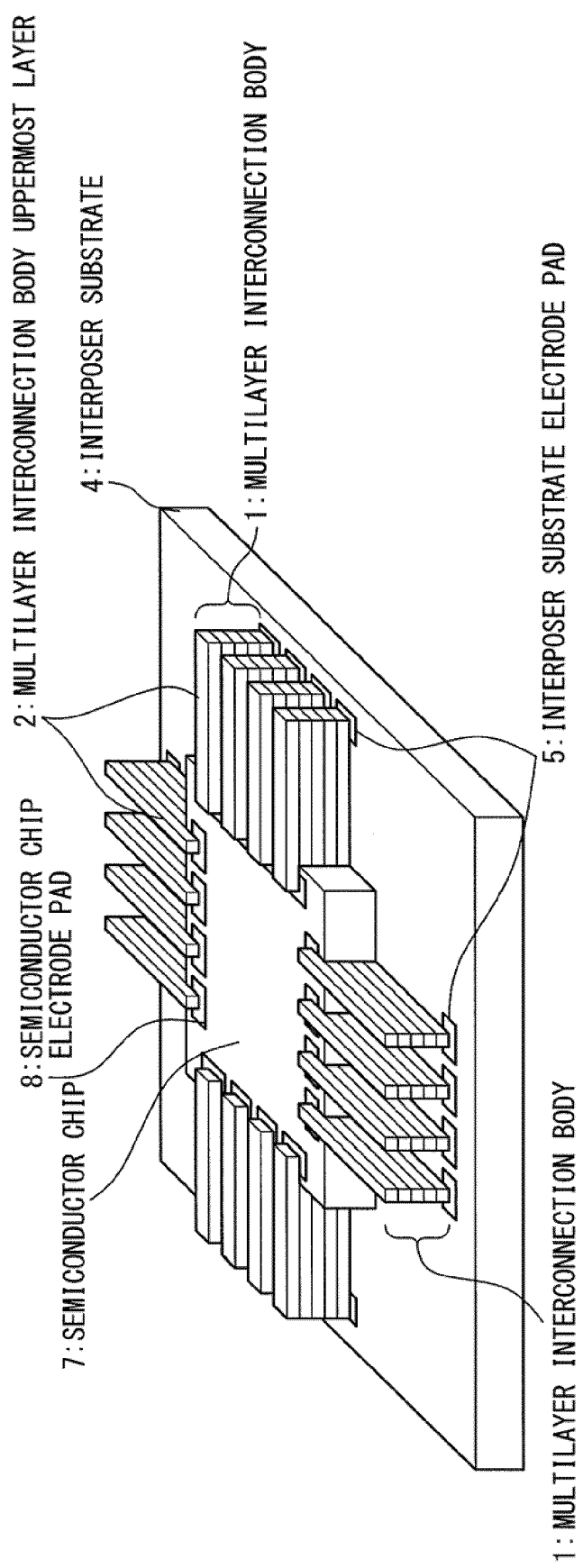
FIG. 3 shows an electronic device package structure according to the first exemplary embodiment.

FIG. 3 is a perspective view schematically showing a basic structure of an electronic device package according to the first exemplary embodiment of the present invention. In the package structure shown in FIG. 3, the multilayer interconnection bodies 1 are formed on an interposer substrate 4. The lowermost layer of each of the multilayer interconnection bodies 1 is connected to an external electrode pad 5 of the interposer substrate. The uppermost layer 2 of the multilayer interconnection body 1 extends to a surface of a semiconductor chip 7 mounted on the interposer substrate 4 and connected to each of semiconductor chip electrode pads 8 formed on the surface of the semiconductor chip 7. The uppermost layer 2 is preferably thinner from the view of making the package thinner. However, the thickness of the uppermost layer 2 is preferably equal to or larger than 0.5 µm and equal to or smaller than 20 µm since a resistance value increases if the package is thinner.

In the package structure according to the present exemplary embodiment, one end of each of the multilayer interconnection bodies 1 is contact with a side surface of the semiconductor chip 8. Therefore, the side surface of the semiconductor chip 8 is preferably insulated.

In the interconnection structure according to the present exemplary embodiment, the multilayer interconnection bodies 1 and the multilayer interconnection body uppermost layers 2 can be formed of, for example, a sintered body of metal fine particles (fine particles of gold, silver, copper or the like), conductive resin or conductive ink (including an organic or inorganic composite in which conductive fine particles are dispersed).

It is preferable to form an interconnection pattern at narrow pitches to provide a high-density interconnection pattern. To form the interconnection pattern at narrow pitches, conductive paste or conductive ink that contains metal fine particles having a particle diameter equal to or smaller than about 20 nm at least partially is preferably used as a raw material. If the material contains such metal fine particles, it is possible to not only narrow pitches but also realize improvement of conductivity by fusion-bonding of the fine particles.

In the case where silver is used as filler of the conductive resin, ion migration that causes short-circuit between interconnections is likely to occur. To improve ion migration resistance, the entire interconnection pattern is preferably covered with a plated layer. The plated layer is preferably formed of a material having a good electrical characteristic, particularly, of Ni, Ni/Au, Ni/Pd/Au or the like.

It should be noted that in FIG. 3, the interconnection pattern is shown to be perpendicular to an end of a step. Needless to say, arrangement of the interconnection pattern is not limited to that shown in FIG. 3, and an angle between the step and the interconnection body may be changed arbitrarily. Moreover, the semiconductor chip electrode pads 8 are those for a fewer-pin type for the sake of convenience. Needless to say, the semiconductor chip electrode pads 8 may be surely those for a multiple-pin type.

After forming the above-stated structure, a surface of the interposer substrate 4 is sealed with insulating resin so as to entirely cover the semiconductor chip 7 and the multilayer interconnection bodies 1, and external terminals are formed, thereby completing the package. The external terminals may be BGA terminals. The external terminals are formed by producing the external electrode pads for the package in free portions of either a rear surface or a front surface of the interposer substrate in advance, and providing convex terminals by soldering or the like as may be necessary. Alternatively, the electronic device package can be formed into a lead type part using the interposer substrate as a lead frame.

According to the electronic device package structure described above, the electronic device package can be made thin by as much as absence of wires, as compared with a case of connecting each of the semiconductor chip electrode pads 8 to one of the external electrode pads 5 of the interposer substrate 4 by wire bonding, so that it is possible to provide the package capable of making a device thin. Furthermore, it is possible to form the interconnection pattern, of which a width-to-height ratio is equal to or higher than 1:1 and which cannot be normally produced by the screen printing method. As a consequence, it is possible to provide a package having a high degree of freedom with which the interconnection pattern can be formed even in a step, having high reliability, imposing lighter burden on environment, and low in cost.

<Electronic Device Package Structure (Second Exemplary Embodiment)>

Figure 4:
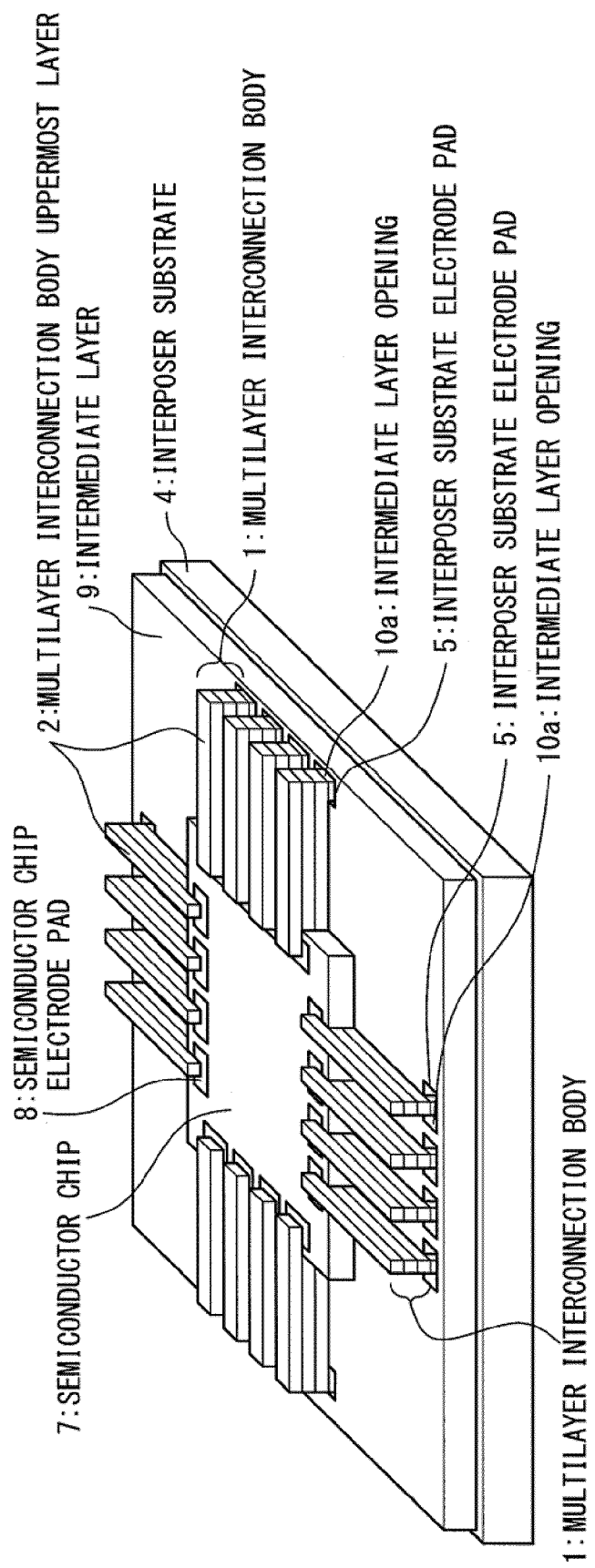
FIG. 4 shows an electronic device package structure according to the second exemplary embodiment.

FIG. 4 is a perspective view schematically showing a basic structure of an electronic device package according to the second exemplary embodiment of the present invention. In the package structure shown in FIG. 4, an intermediate layer (insulating layer) 9 is formed in a portion on an interposer substrate 4 other than portions of a semiconductor chip mounted portion and the interposer substrate electrode pads 5 (invisible in FIG. 4 but present on bottoms of intermediate layer openings 10a). The multilayer interconnection bodies 1 are formed on the intermediate layer 9. The lowermost layer of each of the multilayer interconnection bodies 1 is connected to one of the external electrode pads 5 of the interposer substrate via one of the intermediate layer openings 10a. The uppermost layer 2 of each of the multilayer interconnection bodies 1 extends to a surface of the semiconductor chip 7 mounted on the interposer substrate 4 and connected to one of the semiconductor chip electrode pads 8 formed on the surface of the semiconductor chip 7. The uppermost layer 2 is preferably thinner from the view of making the package thinner. However, the thickness of the uppermost layer 2 is preferably equal to or larger than 0.5 μm and equal to or smaller than 20 μm since a resistance value increases if the package is thinner.

In the package structure according to the present invention, one end of each of the multilayer interconnection bodies 1 contacts a side surface of the semiconductor chip 8. Therefore, the side surface of the semiconductor chip 8 is preferably insulated.

In the interconnection structure according to the present exemplary embodiment, the multilayer interconnection bodies 1 and the multilayer interconnection body uppermost layers 2 can be formed of a sintered body of metal fine particles (fine particles of gold, silver, copper or the like), conductive resin or conductive ink (including an organic or inorganic composite in which conductive fine particles are dispersed).

It is preferable to form an interconnection pattern at narrow pitches to provide a high-density interconnection pattern. To form the interconnection pattern at narrow pitches, conductive paste or conductive ink that contains metal fine particles having a particle diameter equal to or smaller than about 20 nm at least partially is preferably used as a raw material. If the material contains such metal fine particles, it is possible to not only narrow pitches but also realize improvement of conductivity by fusion-bonding of the fine particles.

If silver is used as filler of the conductive resin, ion migration that causes short-circuit between interconnections is likely to occur. To improve ion migration resistance, the entire interconnection pattern is preferably covered with a plated layer. The plated layer is preferably formed of a material having a good electrical characteristic, particularly, of Ni, Ni/Au, Ni/Pd/Au or the like.

The intermediate layer 9 is formed of a material having insulation and reflow heat resistance. In particular, a material having a coefficient of thermal expansion lower than that of the interposer substrate 4 and higher than the semiconductor chip 7 is preferably adopted from the viewpoint of improvement of reliability. It suffices that the intermediate layer 9 is thinner than the semiconductor chip 7 and a lower limit of the thickness of the intermediate layer 9 is not limited specifically.

It should be noted that in FIG. 4, the interconnection pattern is drawn to be perpendicular to the end of a step. Needless to say, arrangement of the interconnection pattern is not limited to that shown in FIG. 4, and an angle between the step and the interconnection body may be changed arbitrarily. Moreover, the semiconductor chip electrode pads 8 are those for a fewer-pin type for the sake of convenience. Needless to say, the semiconductor chip electrode pads 8 may be surely those for a multiple-pin type.

After forming the above-mentioned structure, a surface of the interposer substrate 4 is sealed with insulating resin so as to entirely cover the semiconductor chip 7 and the multilayer interconnection bodies 1, and external terminals are formed, thereby completing the package. The external terminals are, for example, BGA terminals. The external terminals are formed by producing the external electrode pads for the package in a free portion of either a rear surface or a front surface of the interposer substrate in advance, and providing convex terminals by soldering or the like as may be necessary. Alternatively, the electronic device package can be formed into a lead type part by using the interposer substrate as a lead frame.

According to the electronic device package structure described so far, the electronic device package can be made short by as much as absence of wires, as compared with a case of connecting each of the semiconductor chip electrode pads 8 to each of the external electrode pads 5 of the interposer substrate 4 by wire bonding, so that it is possible to provide a package capable of making a device thin. Furthermore, by providing the intermediate layer 9, the number of interconnection layers of each of the multilayer interconnection bodies 1 can be reduced and the number of manufacturing steps can reduced. Due to this, it is possible to provide a package having a high degree of freedom for the interconnection pattern formation targets, having high reliability, imposing lighter burden on environment, and low in cost.

<Electronic Component Package Structure (Third Exemplary Embodiment)>

Figure 5B:
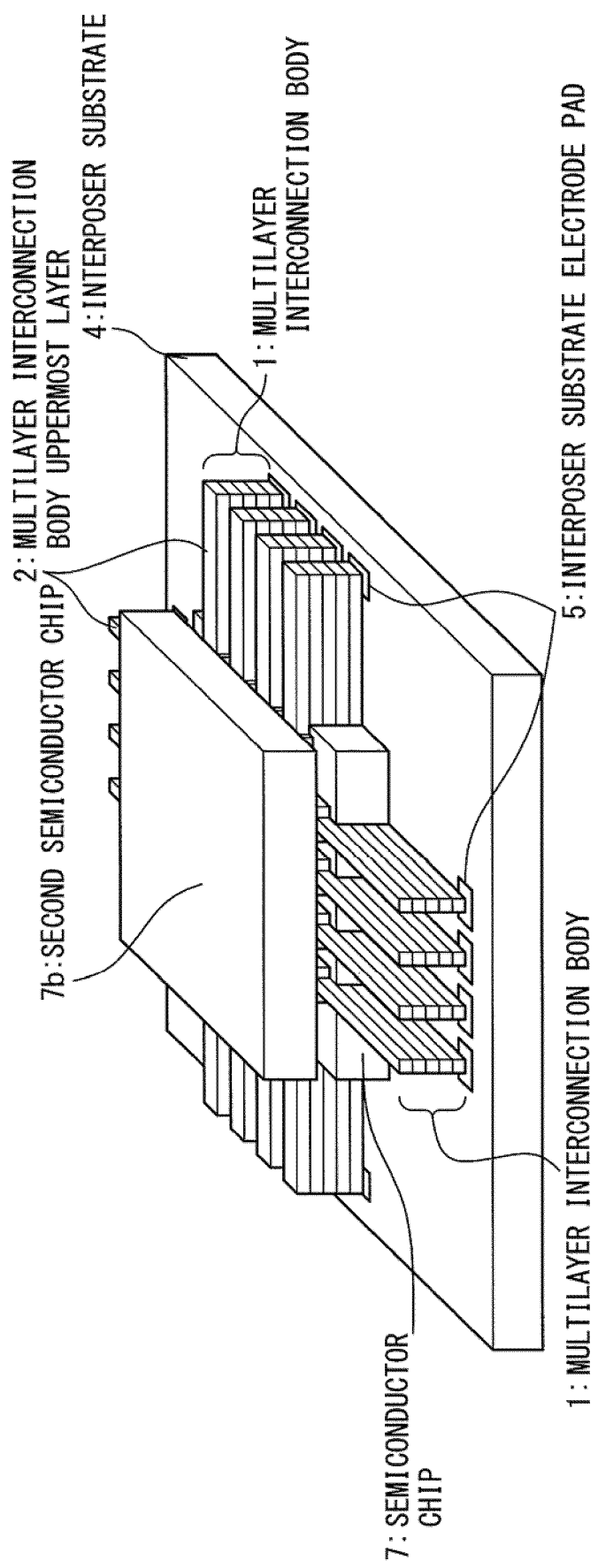
FIG. 5B shows the electronic device package structure according to the third exemplary embodiment.

FIGS. 5A and 5B are perspective views schematically showing a basic structure of an electronic device package according to a third exemplary embodiment of the present invention. In the package structure shown in FIG. 5A, the uppermost layer 2 of each of the multilayer interconnection bodies 1 is formed on an insulating-coat 11 formed on the surface of the semiconductor chip 7 and not connected to each of the semiconductor chip electrode pads 8. The package structure shown in FIG. 5A is similar to that described above in the first exemplary embodiment.

In the structure according to the present exemplary embodiment, it is assumed that the semiconductor chip 7 is connected to the interposer substrate 4 by flip-chip bonding. The insulating film 11 is formed on a rear surface and side surfaces of the semiconductor chip 7. Another electronic device mounting electrode pad 12 is formed on a tip portion of the uppermost layer 2 of each of the multilayer interconnection bodies 1 formed on this insulating film 11. Another device, e.g. a second semiconductor chip 7b is mounted on this electrode pad, thereby forming a multilayer package shown in FIG. 5B.

In the package structure according to the present invention, the uppermost layer 2 is preferably thinner from the view of making the package thinner. However, the thickness of the uppermost layer 2 is preferably equal to or larger than 0.5 μm and equal to or smaller than 20 μm since a resistance value increases if the package is thinner. Further, one end of each of the multilayer interconnection bodies 1 contacts a side surface of the semiconductor chip 8. Therefore, the side surface of the semiconductor chip 8 is preferably insulated.

In an interconnection structure according to the present invention, the multilayer interconnection bodies 1 and the multilayer interconnection body uppermost layers 2 can be formed of a sintered body of metal fine particles (fine particles of gold, silver, copper or the like), conductive resin or conductive ink (including an organic or inorganic composite in which conductive fine particles are dispersed).

It is preferable to form an interconnection pattern at narrow pitches so as to provide a high-density interconnection pattern. To form the interconnection pattern at narrow pitches, conductive paste or conductive ink that contains metal fine particles having a particle diameter equal to or smaller than about 20 nm at least partially is preferably used as a raw material. If the material contains such metal fine particles, it is possible to not only narrow pitches but also realize improvement of conductivity by fusion-bonding of the fine particles.

In the case where silver is used as filler of the conductive resin, ion migration that causes short-circuit between interconnections is likely to occur. To improve ion migration resistance, the entire interconnection pattern is preferably covered with a plated layer. The plated layer is preferably formed of a material having a good electrical characteristic, particularly, of Ni, Ni/Au, Ni/Pd/Au or the like.

In FIGS. 5A and 5B, the interconnection pattern is shown to be perpendicular to the end of a step. Needless to say, an arrangement of the interconnection pattern is not limited to that shown in FIGS. 5A and 5B, and an angle between the step and the interconnection body may be changed arbitrarily. Moreover, the semiconductor chip electrode pads 8 are those for a fewer-pin type for the sake of convenience. Needless to say, the semiconductor chip electrode pads 8 may be surely those for a multiple-pin type.

Alternatively, a part of another type can be mounted in place of the second semiconductor chip shown in FIG. 5B. For example, surface-mount resistances, capacitors or the like may be mounted or an already-packaged device may be mounted.

After forming the above-mentioned structure, a surface of the interposer substrate 4 is sealed with insulating resin so as to entirely cover the semiconductor chip 7, the multilayer interconnection bodies 1 and the second semiconductor chip, and external terminals are formed, thereby completing the package. The external terminals are, for example, BGA terminals. The external terminals are formed by producing the external electrode pads for the package in a free portion of either a rear surface or a front surface of the interposer substrate in advance, and providing convex terminals by soldering as may be necessary. Alternatively, the electronic device package can be formed into a lead type part by using the interposer substrate as a lead frame.

According to the electronic device package structure described above, the electronic device package can be made lower by as much as absence of wires, as compared with a case of connecting each of the semiconductor chip electrode pads 8 to one of external electrode pads 5 of the interposer substrate 4 by wire bonding, so that it is possible to provide a package capable of making a device thin. Furthermore, it is possible to form an interconnection pattern of which a width-to-height ratio is equal to or higher than 1:1 and which cannot be normally produced by the screen printing method. As a consequence, it is possible to provide a package having a high degree of freedom with which the interconnection pattern can be formed even in a step, having high reliability, imposing lighter burden on environment, and low in cost.

Needless to say, the exemplary embodiments relating to the interconnection structures and the package structures shown above can be used by appropriately combining the respective exemplary embodiments.

<Method of Manufacturing Package (First Exemplary Embodiment)>

A method of manufacturing a package according to the first exemplary embodiment of the present invention includes: a preparing step of preparing an interposer substrate and a semiconductor chip; an interconnecting step of printing conductive resin or conductive ink for forming the interconnection pattern at a desired portion other than a semiconductor chip mounted portion on the interposer substrate, supplying the conductive resin or the conductive ink to the desired portion, and then drying the conductive resin or the conductive ink; a multilayer interconnection body forming step of repeatedly printing and drying the interconnection pattern by a desired number of times; a mounting step of mounting the semiconductor chip on the interposer substrate; a multilayer interconnection body uppermost layer printing step of re-printing the conductive resin on a multilayer interconnection pattern so as to extend the multilayer interconnection pattern up to electrode pads on the semiconductor chip; and a hardening step of entirely hardening the conductive resin.

Figure 6A:
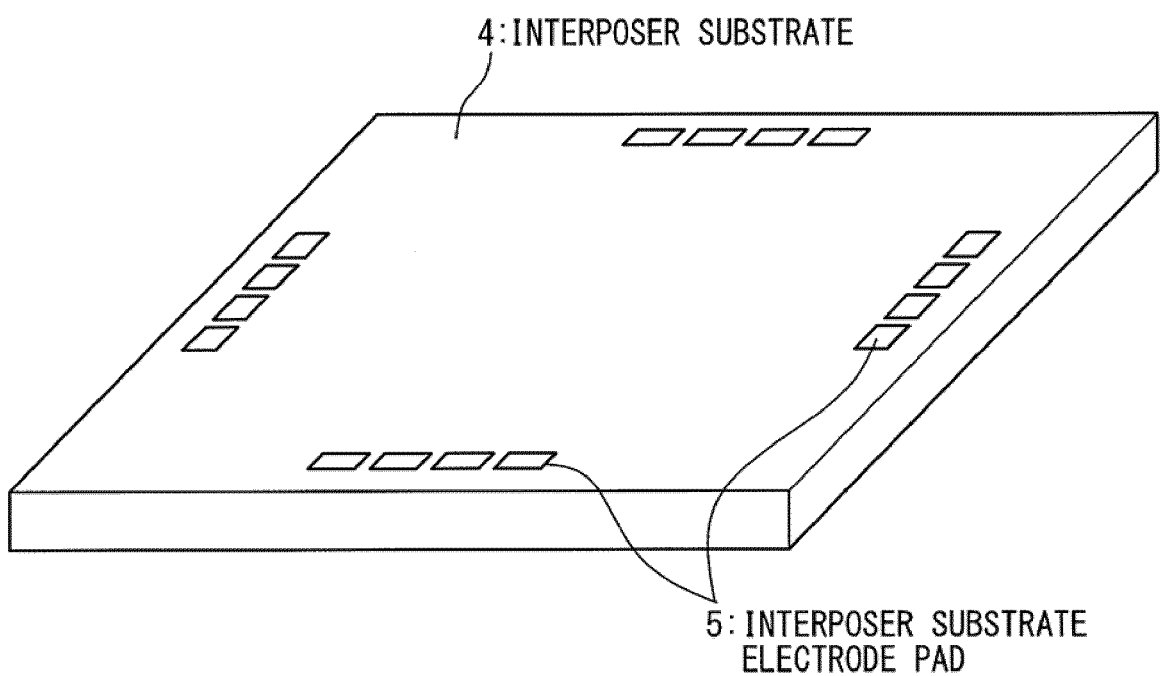
FIG. 6A shows a method of manufacturing the electronic device package according to the first exemplary embodiment.

The steps will be described in detail one by one with reference to FIGS. 6A to 6D. In the preparing step, an interposer substrate 4 including electrode pads 5 is formed (FIG. 6A). While a type of material of insulating resin on a surface of the interposer substrate 4 is not limited as long as the interconnection pattern can be formed on the interposer substrate 4, such a type of material as not to generate migration of the conductive resin is adopted.

In the interconnecting step and the multilayer interconnection body forming step, a step of supplying a conductive member in a desired interconnection shape and drying the conductive member is repeatedly performed (FIG. 6B). This conductive member can be supplied by printing the conductive resin or conductive ink formed of a combination of resin and metal filler. A material of this conductive paste or conductive ink is not limited as long as a desired conductivity, a desired printability, a desired hardening characteristic, desired reliability and the like can be obtained.

To realize a high-density packaging, it is desired to narrow interconnection pitches between respective interconnections. At the same time, it is desired to reduce an interconnection resistance. To meet these conditions, the conductive resin or the conductive ink containing metal fine particles having a particle diameter preferably equal to or smaller than about 20 nm, more preferably equal to or smaller than 15 nm is used. Since metal has a property of being fused at low temperature if a size of the metal is equal to or smaller than several tens of nanometers, micronization of the filler can improve the printability and contribute to improvement of the conductivity. As for formation of the interconnections, a coating method therefor is not limited as long as a desired pattern can be formed using the method. By coating the conductive resin or conductive ink by using the screen printing method using a mask, an inkjet method, a dispensing method or the like, the interconnections are formed. By hardening the coated conductive resin or conductive ink, the conductive resin or conductive ink expresses electric conduction and functions as the interconnection pattern. However, the conductive resin or the conductive ink is not hardened at this time yet.

In the mounting step, the semiconductor chip 7 is mounted on the interposer substrate 4 (FIG. 6C). The mounting step can be performed by using an existing technique. In the present exemplary embodiment, when the semiconductor chip 7 is mounted thereon, the semiconductor chip electrode pads 8 are arranged on the semiconductor chip 7. In place of this arrangement, the semiconductor chip 7 can be mounted on the interposer substrate 4 by being connected to the interposer substrate 4 by flip-chip bonding, similarly to the third exemplary embodiment relating to the package structure. In this case, a rear surface and side surfaces of the semiconductor chip 7 are coated with an insulating film after mounting the semiconductor chip 7.

In the multilayer interconnection body uppermost layer forming step, a conductive layer is formed to an uppermost layer of each of multilayer interconnection bodies to extend to one of the electrode pads 8 of the semiconductor chip. Thereafter, in the hardening step, the conductive resin for forming the multilayer interconnection bodies is entirely hardened. As a result, the interconnection bodies indicate electric conduction and each of the interposer substrate electrode pads 5 is electrically connected to one of the electrode pads 8 of the semiconductor chip (FIG. 6D).

In the package structure according to the present invention, one end of each of the multilayer interconnection bodies 1 contacts the side surface of the semiconductor chip 8. Therefore, it is preferable to perform a step of insulating the side surfaces of the semiconductor chip 8 before the mounting step.

Thereafter, the semiconductor chip 7 and the multilayer interconnection bodies are entirely coated or covered with insulating material, thereby completing a package. This step can be performed by using an existing technique such as injection molding. External terminals for the package are formed using an existing technique. If the external terminals are BGA terminals, the external terminals are formed by producing external electrode pads for the package in a free portion of either a rear surface or a front surface of the interposer substrate in advance, and providing convex terminals by soldering according to necessary. Alternatively, the electronic device package can be formed into a lead type device by using the interposer substrate as a lead frame.

According to the method of manufacturing a semiconductor package described above, it is possible to provide a package capable of making an electronic device thin, having high reliability, imposing lighter burden on environment, and low in cost.

<Method of Manufacturing Package (Second Exemplary Embodiment)>

A method of manufacturing a package according to the second exemplary embodiment of the present invention includes: a preparing step of preparing an interposer substrate and a semiconductor chip; an intermediate layer forming step of forming and providing an intermediate layer that contacts the semiconductor chip at least partially in a desired portion on the interposer substrate other than a semiconductor chip mounted portion and electrode pads; an interconnecting step of printing conductive resin or conductive ink for forming an interconnection pattern at desired positions on the intermediate layer so as to connect the interconnection pattern to electrode pads of the interposer substrate, supplying the conductive resin or the conductive ink to the desired positions, and then drying the conductive resin or the conductive ink; a multilayer interconnection body forming step of repeatedly printing and drying the interconnection pattern for a desired number of times; a mounting step of mounting the semiconductor chip on the interposer substrate; a multilayer interconnection body uppermost layer printing step of re-printing the conductive resin on multilayer interconnection pattern to extend to electrode pads on the semiconductor chip; and a hardening step of entirely hardening the conductive resin.

Figure 7A:
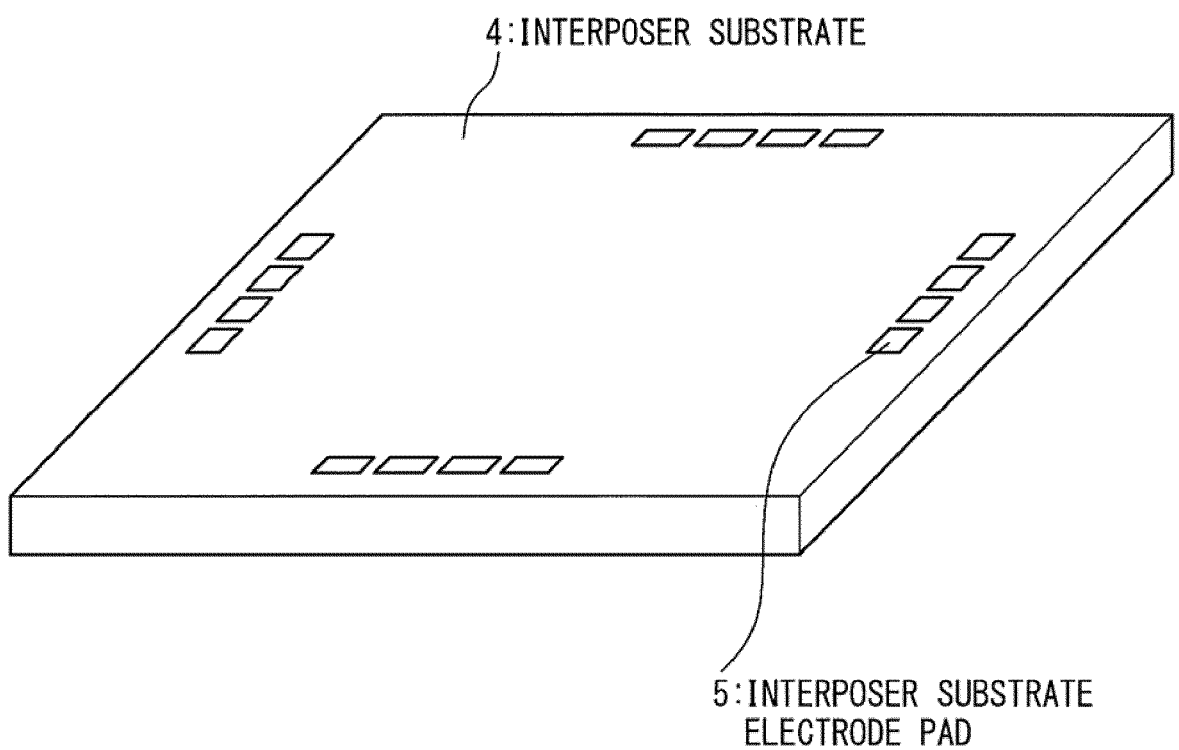
FIG. 7A shows a method of manufacturing the electronic device package according to the second exemplary embodiment.
Figure 7B:
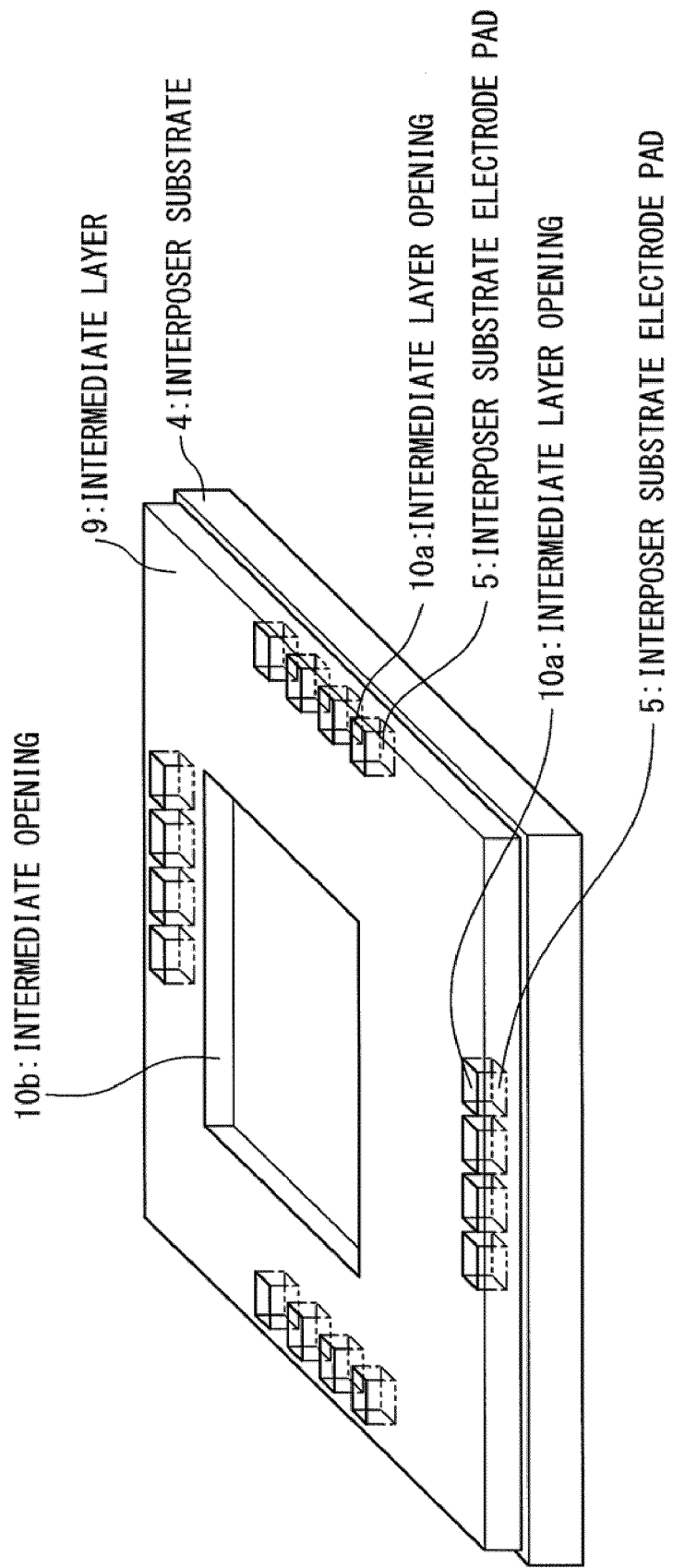
FIG. 7B shows the method of manufacturing the electronic device package according to the second exemplary embodiment.

The steps will be described in detail one by one with reference to FIGS. 7A to 7E. In the preparing step, the interposer substrate 4 including the electrode pads 5 is formed (FIG. 7A). In the intermediate layer forming step, an intermediate layer 9 formed of insulating material is provided in a portion on a surface of the interposer substrate 4 other than a portion on which a semiconductor chip 7 is mounted and external electrode pads 5 are provided. In particular, the intermediate layer 9 preferably has a coefficient of thermal expansion higher than the semiconductor chip and lower than that of the interposer substrate 4 from the viewpoint of improvement of reliability (FIG. 7B).

Figure 7C:
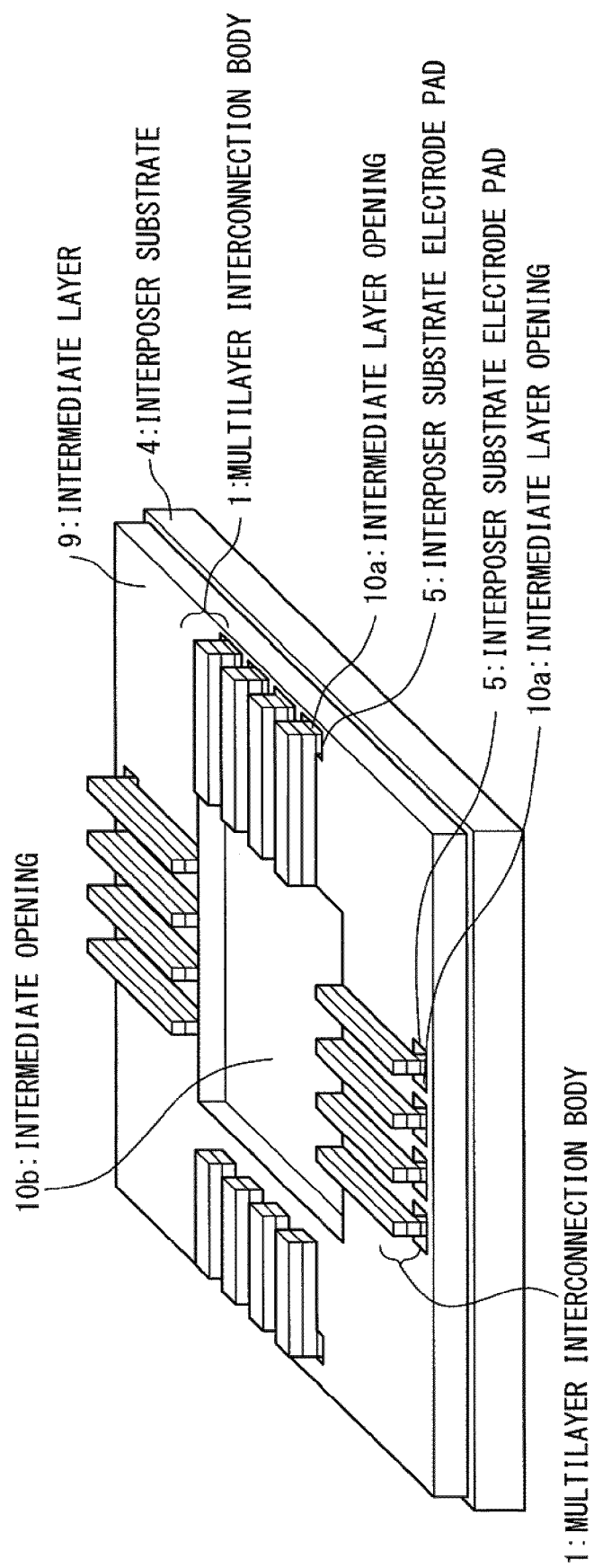
FIG. 7C shows the method of manufacturing the electronic device package according to the second exemplary embodiment.

In the interconnecting step and the multilayer interconnection body forming step, a step of forming a conductive layer on a surface of the intermediate layer 9 in a desired interconnection pattern and drying the conductive layer is repeatedly performed (FIG. 7C). The conductive layer is connected to the interposer substrate electrode pads 5 via the intermediate layer openings 10a according to necessary, and the conductive layer extends to an edge or near the edge of the intermediate layer opening 10b. At this time, a step of filling each of the intermediate layer openings 10a with the conductive member may be added.

This conductive member can be supplied by printing the conductive resin or conductive ink formed of a combination of resin and metal filler. Material of this conductive paste or conductive ink is not limited as long as a desired conductivity, a desired printability, a desired hardening characteristic, desired reliability and the like can be obtained. To realize a high-density packaging, it is desired to narrow interconnection pitches between respective interconnections. At the same time, it is desired to reduce an interconnection resistance. To meet these conditions, the conductive resin or the conductive ink containing metal fine particles at a particle diameter preferably equal to or smaller than about 20 nm, more preferably equal to or smaller than 15 nm is used. Since metal has a property of being fused at low temperature when a size of the metal is equal to or smaller than several tens of nanometers, micronization of the filler can improve the printability and contribute to improvement of the conductivity. As for formation of the interconnections, a coating method therefor is not limited as long as a desired pattern can be formed by using the method. By coating the conductive resin or the conductive ink by using a screen printing method using a mask, an inkjet method, a dispensing method or the like, the interconnection pattern is formed. By hardening the coated conductive resin or the conductive ink, the conductive resin or the conductive ink indicates electric conduction and functions as the interconnection pattern. However, the conductive resin or the conductive ink is not hardened at this time yet.

Figure 7D:
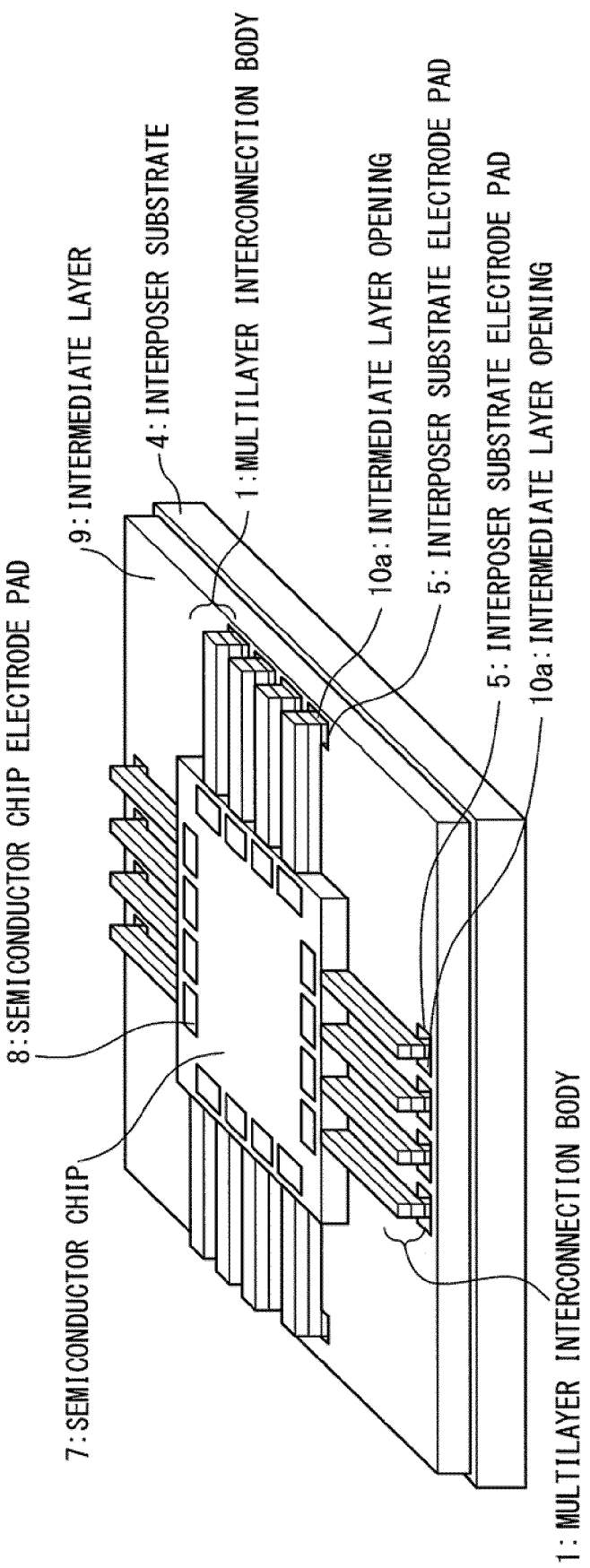
FIG. 7D shows one step in the method of manufacturing the electronic device package according to the second exemplary embodiment.

In the mounting step, the semiconductor chip 7 is mounted on the interposer substrate 4 to insert the semiconductor chip 7 into the intermediate layer opening 10b (FIG. 7D). The mounting step can be performed by using an existing technique. In the present exemplary embodiment, when the semiconductor chip 7 is mounted thereon, the semiconductor chip electrode pads 8 are arranged on the semiconductor chip 7. In place of this arrangement, the semiconductor chip 7 can be mounted on the interposer substrate 4 by connecting to the interposer substrate 4 by flip-chip bonding, similarly to the third exemplary embodiment relating to the package structure. In this case, a rear surface and side surfaces of the semiconductor chip 7 are coated with an insulating film after mounting the semiconductor chip 7.

In the multilayer interconnection body uppermost layer forming step, a conductive member is supplied to an uppermost layer of each of multilayer interconnection bodies to extend to one of the electrode pads 8 of the semiconductor chip. Thereafter, in the hardening step, the conductive resin for forming the multilayer interconnection bodies is entirely hardened. As a result, the interconnection bodies indicate electric conduction and each of the interposer substrate electrode pads 5 is electrically connected to one of the electrode pads 8 of the semiconductor chip (FIG. 7E).

In the package structure according to the present invention, one end of each of the multilayer interconnection bodies 1 contacts the side surface of the semiconductor chip 8. Therefore, it is preferable to perform a step of insulating the side surfaces of the semiconductor chip 8 before the mounting step.

Thereafter, the semiconductor chip 7 and the multilayer interconnection bodies are entirely coated with insulating material, thereby completing a package. This step can be performed using an existing technique such as injection molding. External terminals for the package are formed using an existing technique. If the external terminals are BGA terminals, the external terminals are formed by producing external electrode pads for the package in a free portion of either a rear surface or a front surface of the interposer substrate in advance, and providing convex terminals by soldering or the like according to necessary. Alternatively, the electronic device package can be formed into a lead type device by using the interposer substrate as a lead frame.

According to the method of manufacturing a semiconductor package described above, it is possible to provide a package capable of making an electronic device thin, having high reliability, imposing lighter burden on environment, and low in cost. Needless to say, the exemplary embodiments relating to the interconnection structures and the package structures shown above can be used by appropriately combining the respective exemplary embodiments.

The invention claimed is:

1. An interconnection structure of an electronic equipment, comprising:
    a base substrate having a lower stage surface and an upper stage surface arranged in a first height from said lower stage surface in a normal direction to said lower stage surface; and
    a multilayer interconnection structure comprising:
        a bottom-most layer forming an interconnection extending on said lower stage surface; and
        one or more electrically conductive resin layers laminated on said bottom-most layer in the normal direction,
    wherein an uppermost layer of said plurality of conductive resin layers of said multilayer interconnection structure extends onto said upper stage surface,
    and wherein the bottom-most layer is a lower-most layer of the multilayer interconnection structure.

2. The interconnection structure of the electronic equipment according to claim 1, further comprising:
    a semiconductor device electrically connected with said conductive resin layer on said upper stage surface.

3. The interconnection structure of the electronic equipment according to claim 1, wherein a connection surface which connects said upper stage surface and said lower stage surface is substantially perpendicular to said lower stage surface.

4. The interconnection structure of the electronic equipment according to claim 1, wherein a thickness of said multilayer interconnection structure is larger than an interconnection width of said multilayer interconnection structure.

5. The interconnection structure of the electronic equipment according to claim 1, wherein a thickness of said uppermost layer is from 0.5 μm to 20 μm.

6. The interconnection structure of the electronic equipment according to claim 1, further comprising:
    a semiconductor device arranged under said upper stage surface;
    electrode pads arranged on said upper stage surface and connected to said uppermost layer; and
    an insulating layer configured to insulate said electrode pads and said semiconductor device.

* * * * *